US010475806B2

United States Patent
Yagi et al.

(10) Patent No.: US 10,475,806 B2
(45) Date of Patent: Nov. 12, 2019

(54) SEMICONDUCTOR MEMORY DEVICE INCLUDING STACKED BODY WITH CONDUCTIVITY AND INSULATING MEMBERS AND METHOD FOR MANUFACTURING THE SAME

(71) Applicant: TOSHIBA MEMORY CORPORATION, Tokyo (JP)

(72) Inventors: Mikiko Yagi, Ama Aichi (JP); Hideto Takekida, Nagoya Aichi (JP); Takaya Yamanaka, Yokkaichi Mie (JP); Masaharu Mizutani, Yokkaichi Mie (JP); Hideo Wada, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/907,922

(22) Filed: Feb. 28, 2018

(65) Prior Publication Data

US 2019/0074287 A1 Mar. 7, 2019

(30) Foreign Application Priority Data

Sep. 7, 2017 (JP) ................. 2017-172512

(51) Int. Cl.
| | |
|---|---|
| H01L 27/11575 | (2017.01) |
| H01L 27/12 | (2006.01) |
| H01L 27/11582 | (2017.01) |
| H01L 27/11573 | (2017.01) |
| H01L 23/528 | (2006.01) |
| H01L 21/768 | (2006.01) |

(52) U.S. Cl.
CPC ...... *H01L 27/11575* (2013.01); *H01L 21/768* (2013.01); *H01L 23/528* (2013.01); *H01L 27/11573* (2013.01); *H01L 27/11582* (2013.01); *H01L 27/1207* (2013.01)

(58) Field of Classification Search
CPC ......... H01L 27/11524; H01L 27/11529; H01L 27/11551–11556; H01L 27/11578–11582
See application file for complete search history.

(56) References Cited

U.S. PATENT DOCUMENTS

| | | | |
|---|---|---|---|
| 7,936,004 B2 | 5/2011 | Kito et al. | |
| 2018/0301374 A1* | 10/2018 | Masamori | H01L 21/76877 |

FOREIGN PATENT DOCUMENTS

JP   2007-266143 A   10/2007

* cited by examiner

*Primary Examiner* — Nelson Garces
(74) *Attorney, Agent, or Firm* — Kim & Stewart LLP

(57) ABSTRACT

A semiconductor memory device includes a substrate with a first insulating film thereon, a wiring in the first insulating film, a first electrode film on the first insulating film, a stacked body on the first electrode film, made of alternating second insulating films and second electrode films, a first insulating member extending in a direction to penetrate the stacked body, a first semiconductor film around the first insulating member and connected to the first electrode film, a third insulating film around the first semiconductor film, a first conductive member extending in the direction to penetrate the stacked body and the first electrode film, and connected to the wiring, and a fourth insulating film around the first conductive member. The fourth insulating film has the same film structure as the third insulating film.

8 Claims, 15 Drawing Sheets

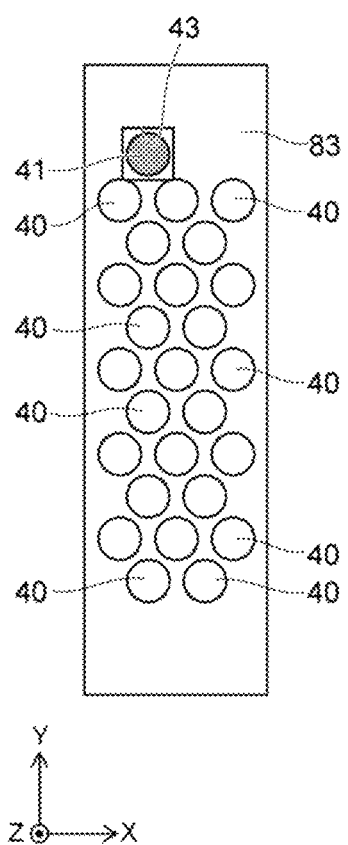

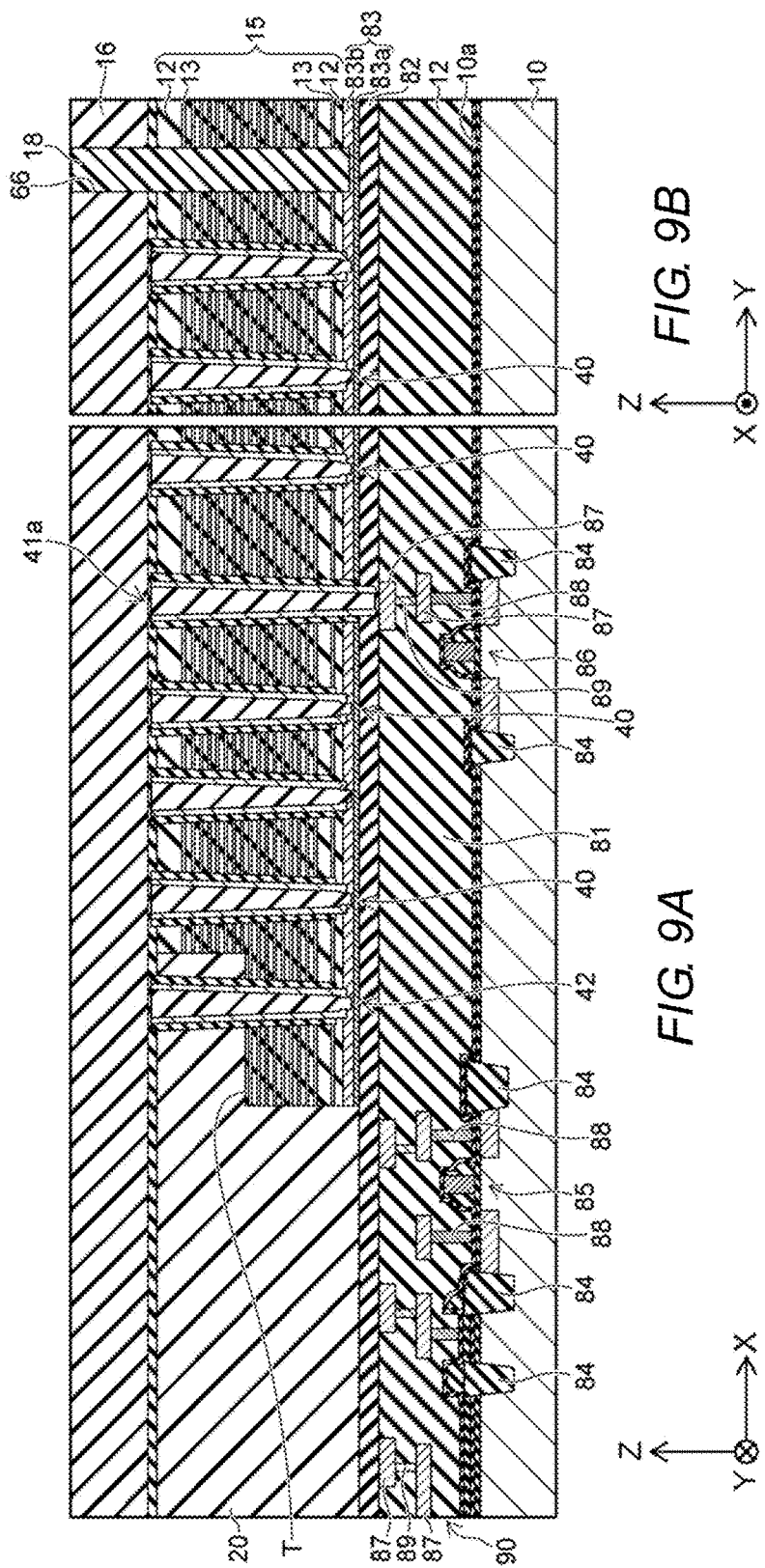

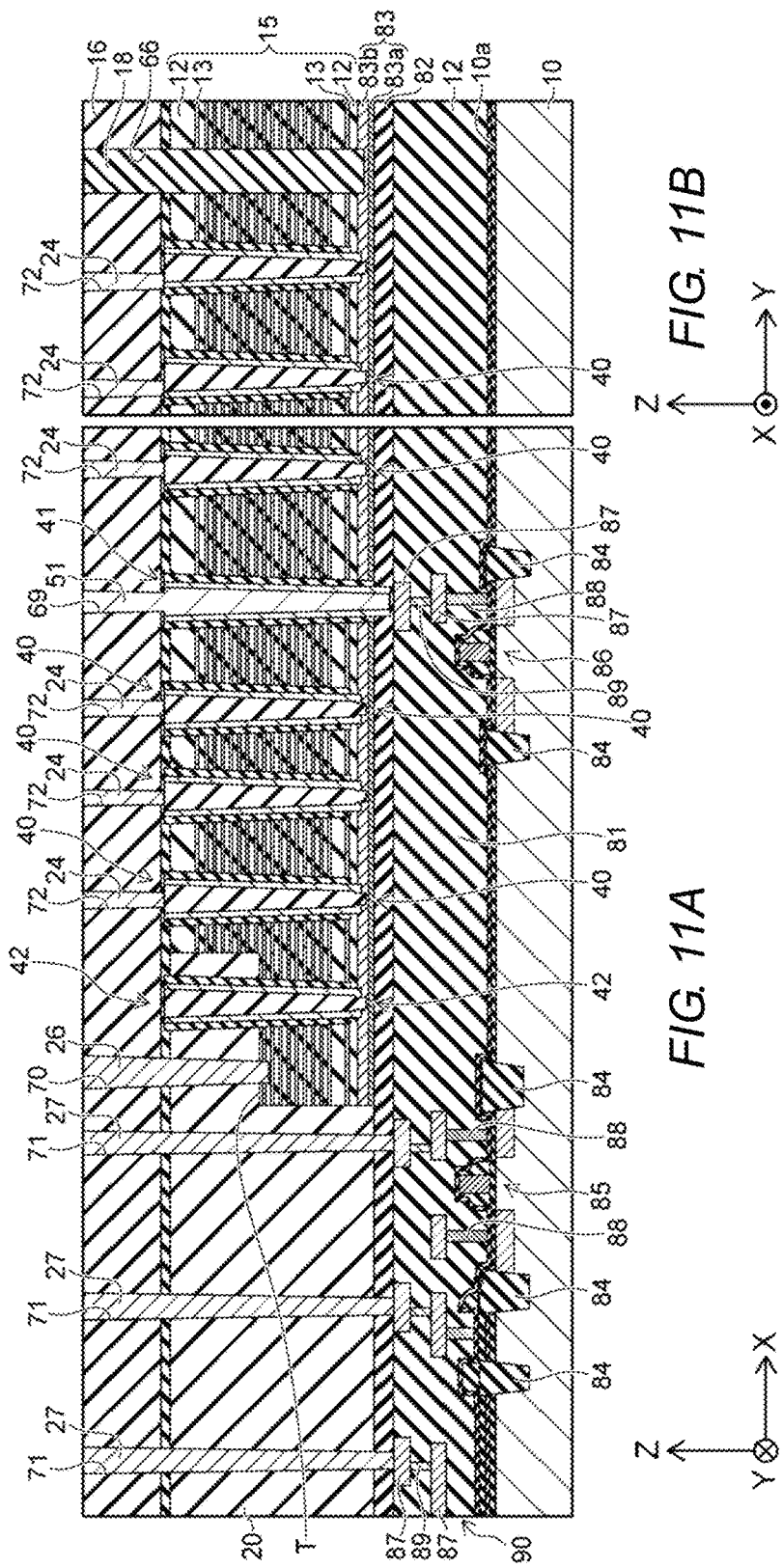

US 10,475,806 B2

SEMICONDUCTOR MEMORY DEVICE INCLUDING STACKED BODY WITH CONDUCTIVITY AND INSULATING MEMBERS AND METHOD FOR MANUFACTURING THE SAME

CROSS-REFERENCE TO RELATED APPLICATION

This application is based upon and claims the benefit of priority from Japanese Patent Application No. 2017-172512, filed Sep. 7, 2017, the entire contents of which are incorporated herein by reference.

FIELD

Embodiments described herein relate generally to a semiconductor memory device and a method for manufacturing the same.

BACKGROUND

Stacked semiconductor memory devices with memory cell transistors integrated in a three-dimensional manner have been suggested. In a stacked semiconductor memory device, a stacked body including electrode films and insulating films alternately stacked therein is provided on a semiconductor substrate. Semiconductor pillars penetrate through the stacked body. Memory cell transistors are formed at intersections between the electrode films and the semiconductor pillars. To improve the integration density of these stacked semiconductor memory devices, a structure has been suggested which includes a driving circuit that is positioned between the semiconductor substrate and the stacked body.

DESCRIPTION OF THE DRAWINGS

FIGS. 2A and 2B are plan views illustrating a region A of FIG. 1. FIG. 2A illustrates a plane including a word line; and FIG. 2B illustrates a plane including a source electrode film.

FIGS. 5A and 5B to 11A and 11B are cross-section views pertaining to a method for manufacturing the semiconductor memory device according to a first embodiment.

FIGS. 12A and 12B are plan views pertaining to a semiconductor memory device according to a second embodiment in which FIG. 12A illustrates a plane including a word line, and FIG. 12B illustrates a plane including a source electrode film.

DETAILED DESCRIPTION

Figure 1:
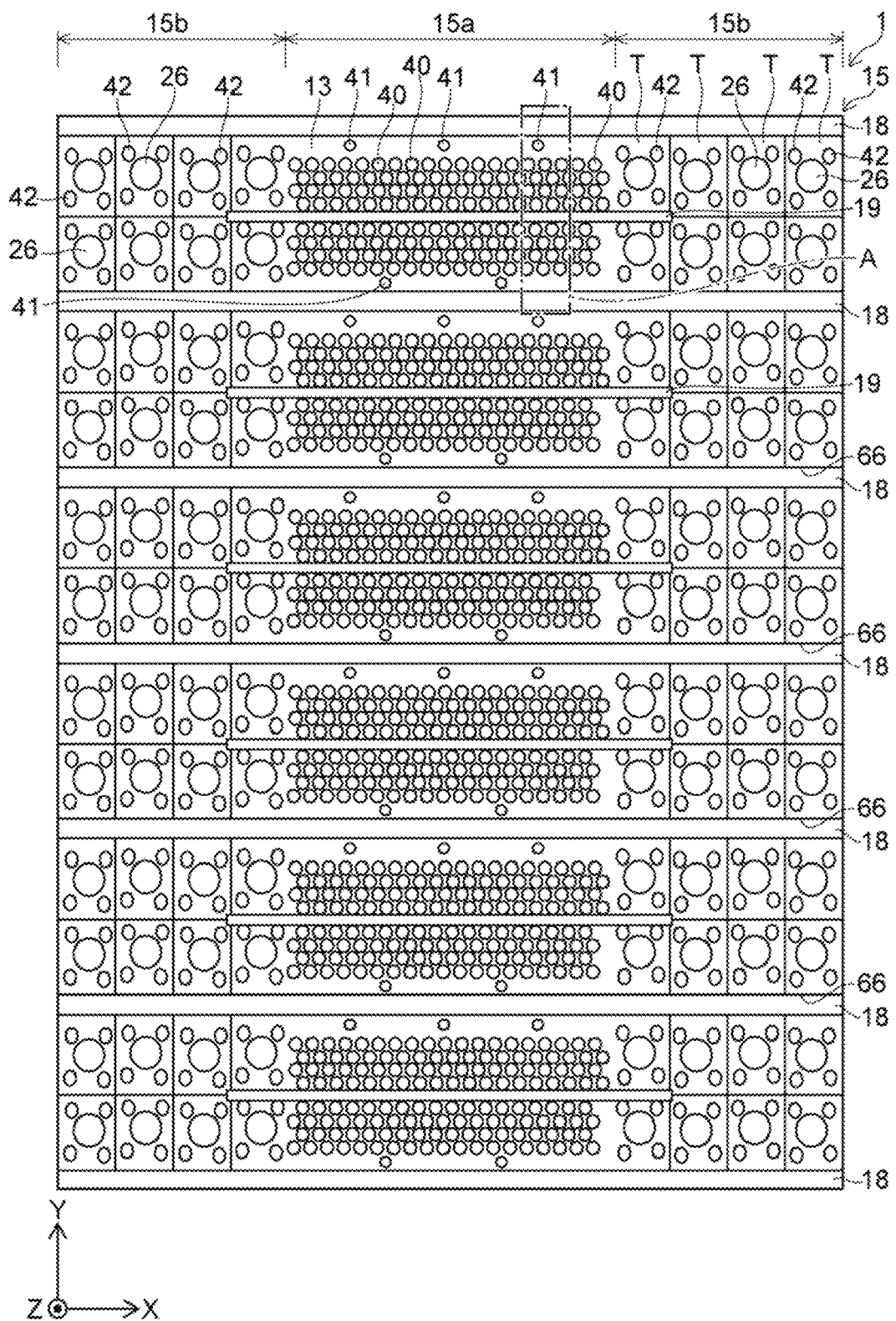
FIG. 1 is a plan view illustrating a semiconductor memory device according to a first embodiment.

In general, according to an embodiment, a semiconductor memory device comprises a semiconductor substrate, a first insulating film on the semiconductor substrate, a wiring in the first insulating film, a first electrode film on the first insulating film, a stacked body on the first electrode film, the stacked body comprising second insulating films and second electrode films alternately stacked along a first direction in which the semiconductor substrate, the first insulating film, and the first electrode film are arranged. Also included are a first insulating member extending in the first direction and penetrating through the stacked body to the first electrode film, a first semiconductor film around the first insulating member and connected to the first electrode film, a third insulating film around the first semiconductor film, a first conductive member extending in the first direction and penetrating the stacked body and the first electrode film, and connected to the wiring, and a fourth insulating film around the first conductive member, wherein the fourth insulating film has the same film structure as the third insulating film.

In general, according to another embodiment, a method for manufacturing a semiconductor memory device is provided, comprising forming a first insulating film on a semiconductor substrate, the first insulating film comprising a first wiring, forming a first electrode film on the first insulating film, forming a stacked body on the first electrode film by alternately stacking second insulating films and first films, processing an end portion of the stacked body in a second direction into a stair shape with a terrace formed at each of the first films, the second direction crossing a first direction in which the semiconductor substrate, the first insulating film, and the first electrode film are arranged, forming a third insulating film to cover the end portion, forming a first hole extending in the first direction through the stacked body, and forming a second hole through the stacked body and the first electrode film. Then a fourth insulating film on inner surfaces of the first and second holes is formed by depositing a first insulating material, forming a semiconductor film on a surface of the fourth insulating film by depositing a semiconductor material, forming an insulating member on a surface of the semiconductor film and in the first and second holes by depositing a second insulating material, forming a slit extending in the first direction in the stacked body, removing the first film via the slit, forming a second electrode film in a space formed by removing the first film, forming a third hole in the insulating member inside the second hole to the first wiring, forming a fourth hole in the insulating member inside the first hole to the second electrode film and forming a first conductive member in the third hole that connects to the first wiring and forming a second conductive member in the fourth hole that connects to the second electrode film, by depositing a conductive material.

(First Embodiment)

FIG. 1 is a plan view illustrating a semiconductor memory device according to an embodiment.

Figure 2A:
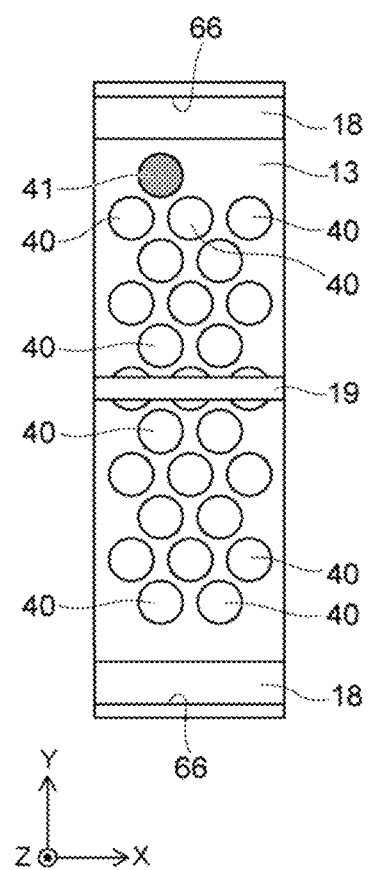

FIGS. 2A and 2B are plan views illustrating a region A of FIG. 1. FIG. 2A illustrates a plane including a word line, and FIG. 2B illustrates a plane including a source electrode film.

Figures 3A, 3B:
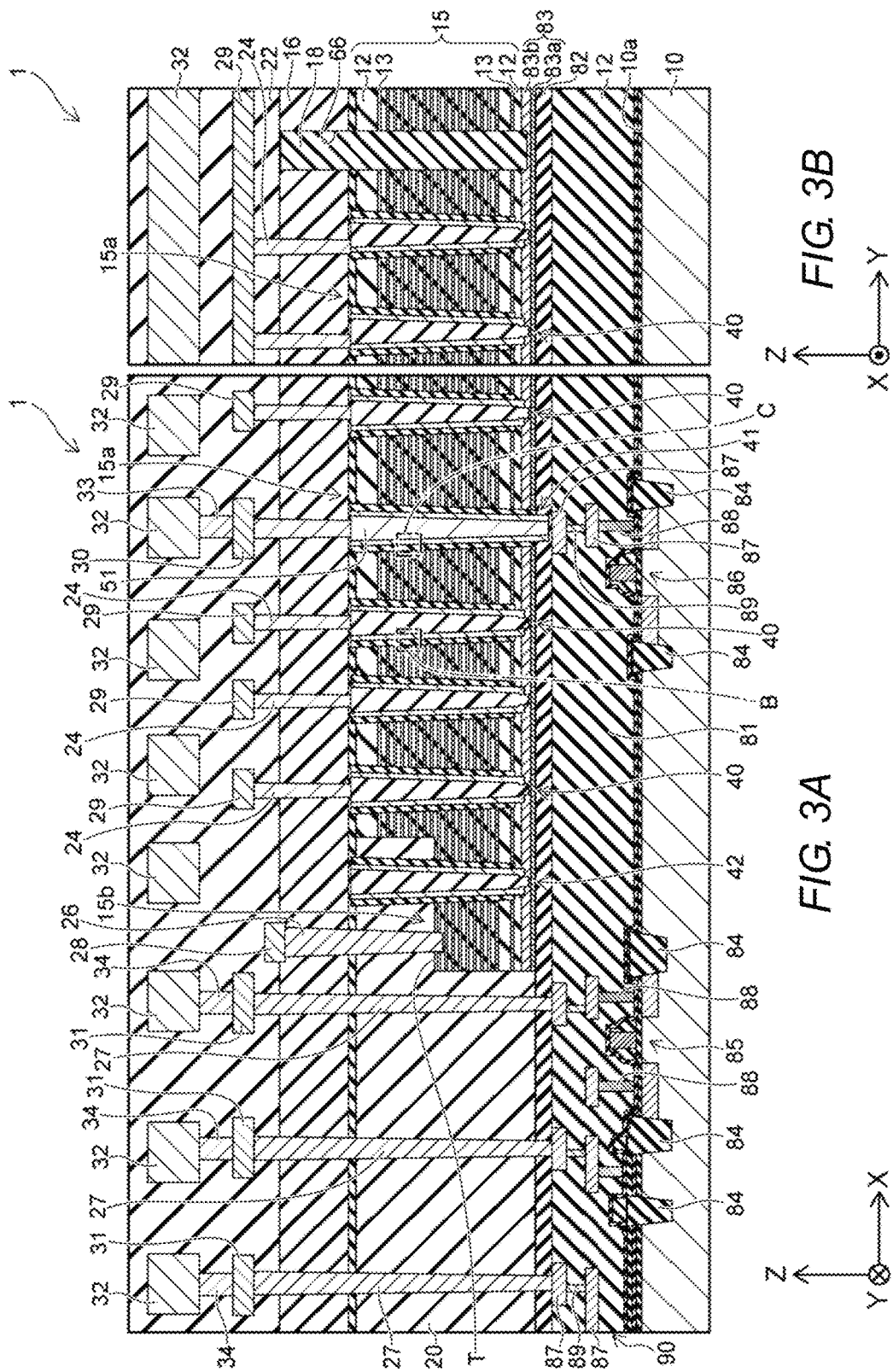
FIGS. 3A and 3B are cross-section views illustrating the semiconductor memory device according to a first embodiment.

FIGS. 3A to 3B are cross-sectional views illustrating the semiconductor memory device according to an embodiment.

Figure 4A:
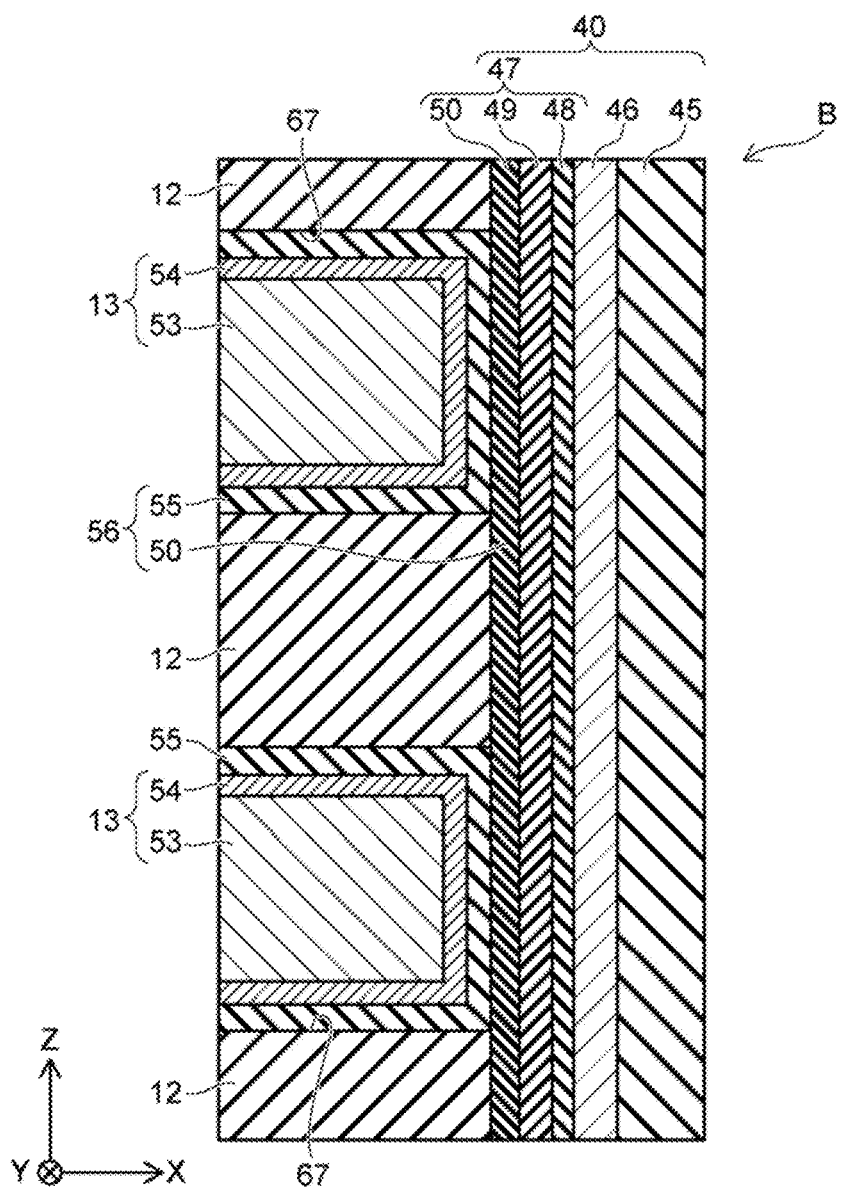
FIG. 4A is a cross-section view illustrating a region B of FIG. 3A.
Figure 4B:
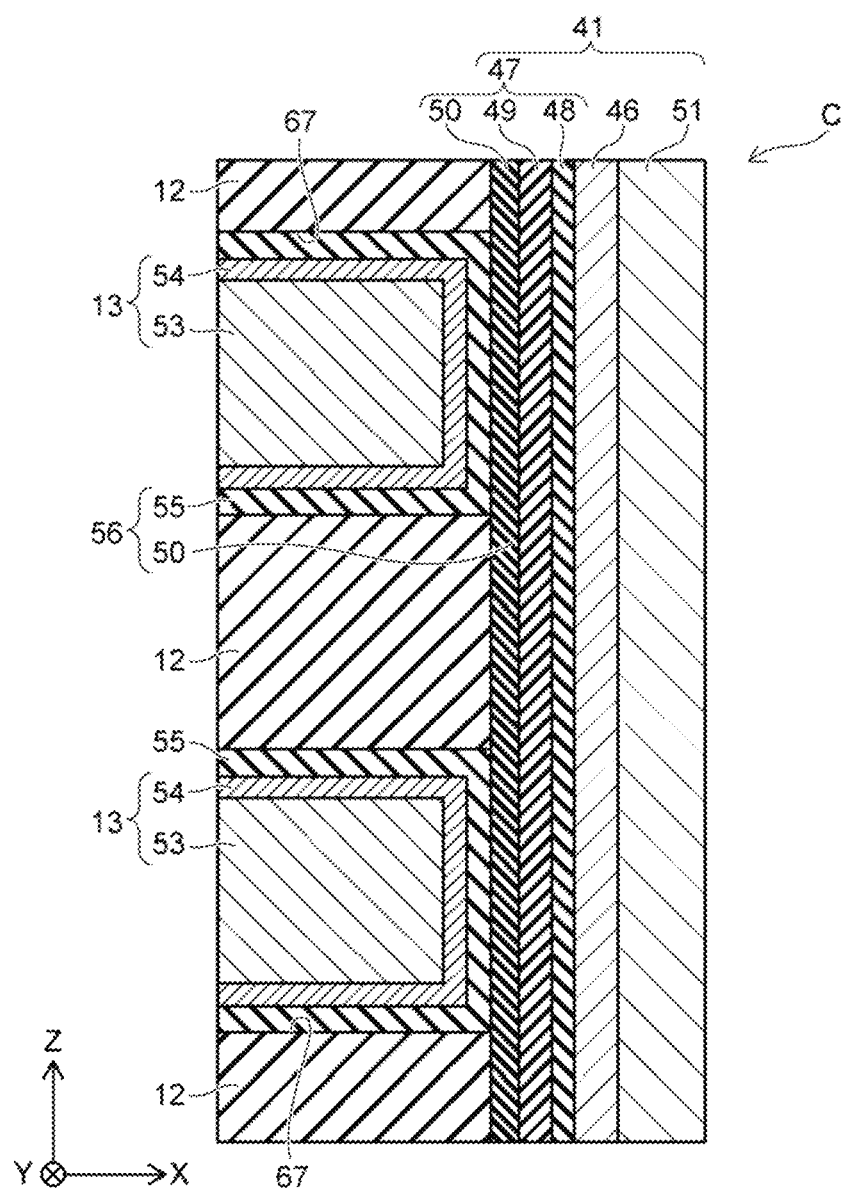
FIG. 4B is a cross-section view illustrating a region C of FIG. 3A.

FIG. 4A is a cross-sectional view illustrating a region B of FIG. 3A, and FIG. 4B is a cross-sectional view illustrating a region C of FIG. 3A.

The drawings are schematic illustrations, and elements of the semiconductor memory device may be exaggerated and/or omitted in the drawings. In general, the depicted total numbers and dimensional ratios of the elements do not necessarily coincide with an actual device or process.

The semiconductor memory device according to a first embodiment is a stacked NAND flash memory.

As illustrated in FIGS. 1 to 3B, the semiconductor memory device 1 comprises a silicon substrate 10. The silicon substrate 10 is formed of silicon (Si) single crystal (monocrystalline silicon), for example. An interlayer insulating film 81 is on the silicon substrate 10. The interlayer insulating film 81 is formed of silicon oxide (SiO), for example. A stopper insulating film 82 including silicon nitride (SiN) is provided on the interlayer insulating film 81. A source electrode film 83 is provided on a part of the stopper insulating film 82. The source electrode film 83 includes a metal layer 83a and a polysilicon layer 83b stacked on the metal layer 83a. The polysilicon layer 83b contains added impurities.

In this specification, an XYZ orthogonal coordinate system is adopted for convenience of description, but is not a limitation or requirement. In the XYZ orthogonal coordinate system, two directions crossing each other at a right angle while being in parallel to the upper surface 10a of the silicon substrate 10 are referred to as an X-direction and a Y-direction, and a direction perpendicular to the upper surface 10a of the silicon substrate 10 is referred to as a Z-direction. In the Z-direction, a direction facing the source electrode film 83 from the silicon substrate 10 may be referred to as the top or upper side, and the opposite side thereof may be referred to as the bottom or lower side. However, these directions are only relational expressions, and have nothing to do with the direction of gravity.

In this specification, "silicon substrate" refers to a substrate which is mainly composed of silicon. For other elements, when the name of an element includes the name of a material, the main component of the element will be that material. Moreover, since silicon is a semiconductor material, the silicon substrate can be considered a semiconductor substrate of a general type unless otherwise indicated by specific descriptions. The same principle is applied to other elements besides silicon. That is, the characteristics of an element reflects the characteristics of its main component.

An under-cell circuit 90 is formed in the upper portion of the silicon substrate 10 and the interlayer insulating film 81 is disposed thereon. The under-cell circuit 90 is, for example, a part of the driving circuit that operates to write, read, or erase data to or from a memory cell transistor MC. The under-cell circuit 90 includes a sense amplifier. For example, the upper portion of the silicon substrate 10 is divided into a plurality of active areas by a STI (Shallow Trench Isolation) 84, such that an n-type MOSFET (Metal-Oxide-Semiconductor Field-Effect Transistor) 85 is formed in an active area and a p-type MOSFET 86 is formed in another active area. The interlayer insulating film 81 includes wirings 87 provided in multiple portions and levels, contacts 88 connecting the respective wirings 87 to the silicon substrate 10, and vias 89 connecting the wirings 87.

Silicon oxide films 12 and electrode films 13 are alternately stacked on the source electrode film 83 along the Z-direction. A stacked body 15 is formed by the plurality of silicon oxide films 12 and electrode films 13 which are alternately stacked. The source electrode film 83 is disposed only immediately under the stacked body 15.

Both end portions 15b of the stacked body 15 in the X-direction are formed in a stair shape. The end portion 15b has terraces T formed at the respective electrode films 13. FIG. 3A illustrates only one terrace T, in order to simplify the illustration. An interlayer insulating film 20 is provided on the source electrode film 83 such that the end portions 15b of the stacked body 15 are buried in the interlayer insulating film 20. The interlayer insulating film 20 is formed of silicon oxide, for example.

An insulating film 16 is provided on the stacked body 15 and the interlayer insulating film 20, the insulating film 16 being formed of silicon oxide, for example. The stacked body 15 and the insulating film 16 have a slit 66 extending in the X-direction. The slit 66 divides the stacked body 15 and the insulating film 16 in the Y-direction. In the stacked body 15 divided by the slit 66, the electrode films 13 extend in the X-direction. That is, the dimension of the electrode film 13 in the X-direction is larger than the dimension (thickness) of the electrode film 13 in the Z-direction and the dimension (width) of the electrode film 13 in the Y-direction. In the slit 66, a silicon oxide plate 18 is provided. A silicon oxide member 19 is provided at the top of the Y-direction central portion of the stacked body 15 divided by the slit 66, the silicon oxide member 19 extending in the X-direction. A columnar body 40 may be provided immediately under the silicon oxide member 19. However, in general, such a columnar body 40 is a dummy element which does not electrically function.

The columnar bodies 40 extending in the Z-direction through the stacked body 15 are provided in the X-direction central portion 15a of the stacked body 15. Between the silicon oxide plates 18 adjacent to each other, the columnar bodies 40 are periodically arranged along a plurality of columns, for example, eight columns extending in the X-direction. As shown generally in the figures, four columns of columnar bodies 40 are disposed at both sides of the silicon oxide member 19 in the Y-direction. When seen from the Z-direction, the columnar bodies 40 are arranged in a zigzag manner. The arrangement of the columnar bodies 40 is not limited to eight columns, but may be set to four columns. The lower ends of the columnar bodies 40 are in contact with the source electrode film 83. The internal structure of the columnar body 40 will be described later.

Figure 12A:
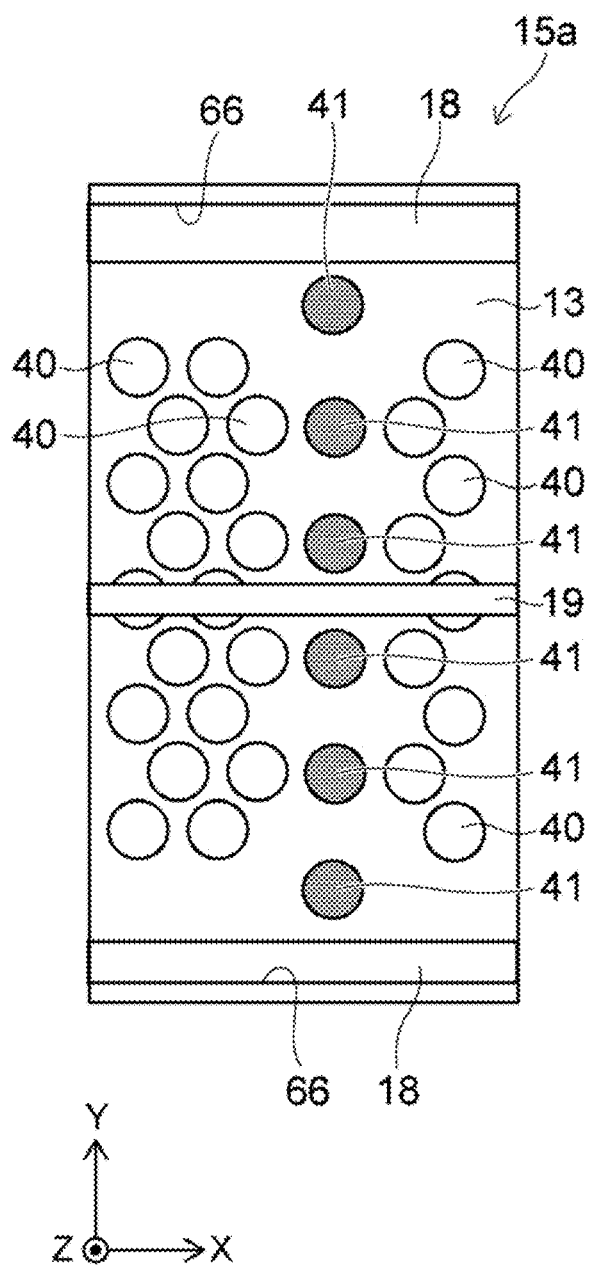
Figure 12B:
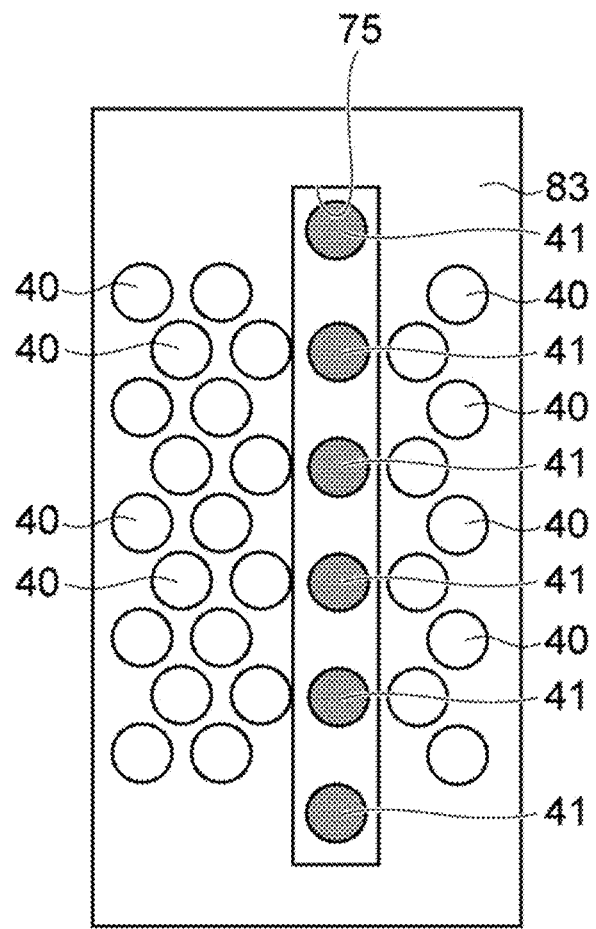

A columnar body 41 is provided in the central portion 15a of the stacked body 15, and extends in the Z-direction through the stacked body 15, the source electrode film 83 and the stopper insulating film 82. The columnar body 41 is disposed between the columnar body 40 and the silicon oxide plate 18 in the Y-direction. The columnar body 41 is in contact with the wiring 87 of the under-cell circuit 90 through the stacked body 15, the source electrode film 83 and the stopper insulating film 82. The source electrode film 83 and the stopper insulating film 82 have an opening 43 formed at a portion through which the columnar body 41 passes. For this reason, since the columnar body 41 is separated from the source electrode film 83 and the stopper insulating film 82, the columnar body 41 is not in contact with the source electrode film 83 and the stopper insulating film 82. The internal structure of the columnar body 41 will be described later. In FIGS. 2A and 2B, the columnar body 41 is colored in gray, in order to distinguish the columnar body 41 from the columnar body 40. In FIGS. 12A and 12B, the columnar body 41 is also colored in gray.

A columnar body 42 is provided in the end portion 15b of the stacked body 15 and the interlayer insulating film 20, and extends in the Z-direction through the interlayer insulating film 20 and the end portion 15b. The lower end of the columnar body 42 is in contact with the source electrode film 83. The internal structure of the columnar body 42 will be described later.

An insulating film 22 is provided on the insulating film 16, the insulating film 22 being formed of silicon oxide, for example. A plug 24 is provided in the insulating film 16 and the insulating film 22 so as to extend in the Z-direction. Contacts 26 and 27 are provided in the interlayer insulating film 20, the insulating film 16 and the insulating film 22 so as to extend in the Z-direction. Moreover, a wiring 28 is provided in the insulating film 22, a bit line 29 and intermediate wirings 30 and 31 are provided over the wiring 28 so as to extend in the Y-direction, and an upper wiring 32 is provided over the bit line 29 and the intermediate wirings 30 and 31.

The lower end of the plug 24 is connected to the columnar body 40, and the upper end of the plug 24 is connected to the bit line 29. The lower end of the contact 26 is connected to the electrode film 13, and the upper end of the contact 26 is connected to the wiring 28. The lower end of the contact 27 is connected to the wiring 87 of the under-cell circuit 90, and the upper end of the contact 27 is connected to the intermediate wiring 31. The intermediate wiring 30 is connected to one upper wiring 32 through a via 33. The intermediate wiring 31 is connected to another upper wiring 32 through a via 34.

As illustrated in FIGS. 3A and 4A, the columnar body 40 has a core member 45 formed of silicon oxide, for example. The core member 45 is formed in a cylindrical shape extending in the Z-direction. A channel film 46 is provided around the core member 45, the channel film 46 being formed of polysilicon. A memory film 47 is provided around the channel film 46. The memory film 47 includes a tunnel insulating film 48, a charge storage film 49 and a silicon oxide layer 50 which are sequentially arranged from inside toward outside. The channel film 46, the tunnel insulating film 48, the charge storage film 49 and the silicon oxide layer 50 are formed in a cylindrical shape extending in the Z-direction. The upper end of the channel film 46 of the columnar body 40 is connected to the plug 24, and the lower end of the channel film 46 is connected to the source electrode film 83. The columnar body 42 has the same structure as the columnar body 40.

The tunnel insulating film 48 has an insulating property normally. However, when a predetermined voltage within the range of a driving voltage of the semiconductor memory device 1 is applied, the tunnel insulating film 48 allows a tunnel current to flow. For example, the tunnel insulating film 48 is formed of silicon oxide. The charge storage film 49 has an ability to store a charge, and is formed of silicon nitride, for example.

As illustrated in FIGS. 3A and 4B, the columnar body 41 includes a through-contact 51 formed of a metallic material such as tungsten (W), for example. The through-contact 51 is formed in a cylindrical shape extending in the Z-direction. The lower end of the through-contact 51 is connected to the wiring 87 of the under-cell circuit 90. The upper portion of the through-contact 51 enters the insulating film 22 through the insulating film 16, such that the upper end thereof is connected to the intermediate wiring 30. The channel film 46 formed of polysilicon is provided around the portion of the through-contact 51, which is disposed in the stacked body 15. The memory film 47 is provided around the channel film 46. The channel film 46 of the columnar body 41 is formed at the same time as the channel film 46 of the columnar body 40, and has substantially the same composition as the channel film 46 of the columnar body 40.

That is, the columnar bodies 40 and 41 have something in common in that the channel films 46 and 47 are provided therein. However, the columnar bodies 40 and 41 are different from each other in that the columnar body 40 has the core member 45 and the columnar body 41 has the through-contact 51. The film 47 of the columnar body 41 is formed at the same time as the memory film 47 of the columnar body 40, and has the same structure as the memory film 47 of the columnar body 40. Specifically, the memory film 47 of the columnar body 41 has substantially the same composition and thickness as the memory film 47 of the columnar body 40.

When the memory films are referred to as having "the same structure," in this context, it generally indicates that the plurality of films or layers constituting each of these memory films is arranged in the same order. Specifically, the tunnel insulating film 48, the charge storage film 49 and the silicon oxide layer 50 which are provided in the memory film 47 of the columnar body 41 are also arranged in the same order in the memory film 47 of the columnar body 40. However, it is not required that these aspects be to exactly the same, but may include differences caused by variations in a process conditions. The tunnel insulating film 48 of the columnar body 40 has substantially the same composition, thickness and shape as the tunnel insulating film 48 of the columnar body 41, the charge storage film 49 of the columnar body 40 has substantially the same composition, thickness and shape as the charge storage film 49 of the columnar body 41, and the silicon oxide layer of the columnar body 40 has substantially the same composition, thickness and shape as the silicon oxide layer 50 of the columnar body 41.

The contact 26 includes a metallic material such as tungsten, for example. The contact 26 and the through-contact 51 are formed at the same time, and have substantially the same composition. That is, the channel film 46 and the memory film 47 of the columnar body 41 have the same composition as the channel film 46 and the memory film 47 of the columnar body 40, and the through-contact 51 has the same composition as the contact 26. The contact 27 also includes a metallic material such as tungsten, for example. The contact 27 may also have the same composition as the contact 26 and the through-contact 51.

The electrode film 13 includes a main body portion 53 formed of tungsten, and the main body portion 53 has a barrier metal layer 54 provided on the surface thereof, the barrier metal layer 54 being formed of titanium nitride (TiN), for example. Furthermore, an aluminum oxide layer 55 is provided on the surface of the electrode film 13. The silicon oxide layer 50 and the aluminum oxide layer 55 constitute a block insulating film 56. The block insulating film 56 does not pass a current even though a voltage within the range of the driving voltage of the semiconductor memory device 1 is applied.

In the stacked body 15, one or more electrode films 13 from the top function as upper select gate lines, and upper select gate transistors are installed at the respective intersections between the upper select gate lines and the columnar body 40. The silicon oxide member 19 is disposed between the upper select gate lines. Moreover, one or more electrode films 13 from the bottom function as lower select gate lines, and lower select gate transistors are installed at the respective intersections between the lower select gate lines and the columnar body 40.

The electrode films 13 other than the lower and upper select gate lines function as word lines, and memory cell transistors MC are installed at the respective intersections between the word lines and the columnar body 40. Therefore, the plurality of memory cell transistors MC is connected in series to each other along each of the columnar bodies 40, and the lower select gate transistor and the upper select gate transistor are connected to both ends of the columnar body 40, thereby forming a NAND string.

Next, a method for manufacturing the semiconductor memory device according to an embodiment will be described.

FIGS. 5A to 11B are cross-section views illustrating structures relevant to a method for manufacturing the semiconductor memory device according to an embodiment.

Figures 5A, 5B:
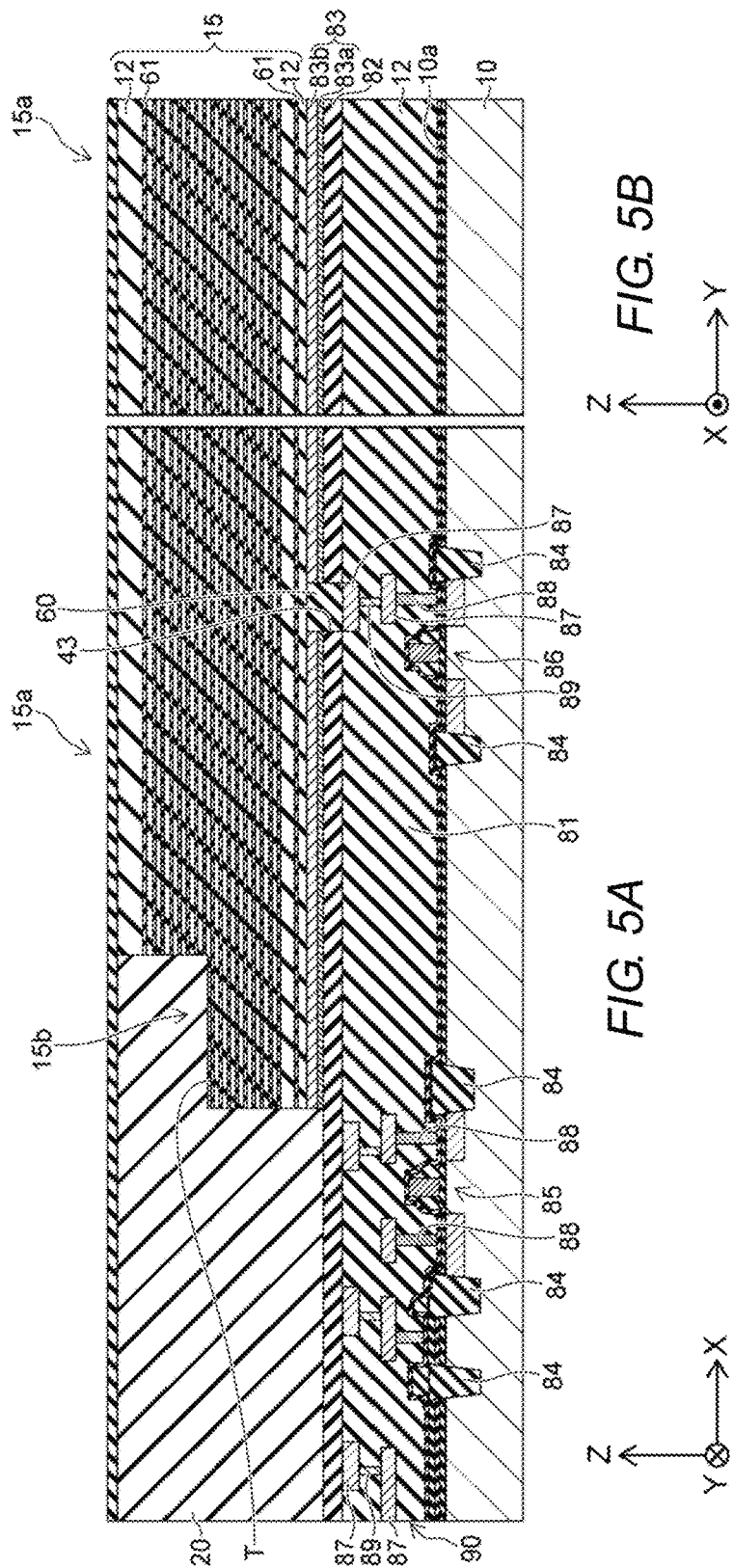

First, as illustrated in FIGS. 5A and 5B, an interlayer insulating film 81 is formed on a silicon substrate 10. An under-cell circuit 90 is formed in the upper portion of the silicon substrate 10 and the interlayer insulating film 81. Then, a stopper insulating film 82 is formed on the interlayer insulating film 81, and a source electrode film 83 is formed on the stopper insulating film 82. The stopper insulating film 82 and the source electrode film 83 have an opening 43 formed in a region through which a columnar body 41 is to be formed. The opening 43 is filled with a sacrifice member 60 formed of silicon oxide, for example.

Then, silicon oxide films 12 and silicon nitride films 61 are alternately stacked on the source electrode film 83, thereby forming a stacked body 15. Then, both end portions 15b of the stacked body 15 in the X-direction are processed in a stair shape. This process includes alternately performing a step of forming a resist film on the stacked body 15 and performing etching using the resist film as a mask and a step of slimming (also referred to as trimming in some contexts) the resist film. During this process, the source electrode film 83 is removed except for a portion disposed immediately under the stacked body 15. Then, silicon oxide is deposited on the entire surface, and a planarization process such as CMP (Chemical Mechanical Polishing) is performed in order to form an interlayer insulating film 20 to cover the end portion 15b of the stacked body.

Figures 6A, 6B:
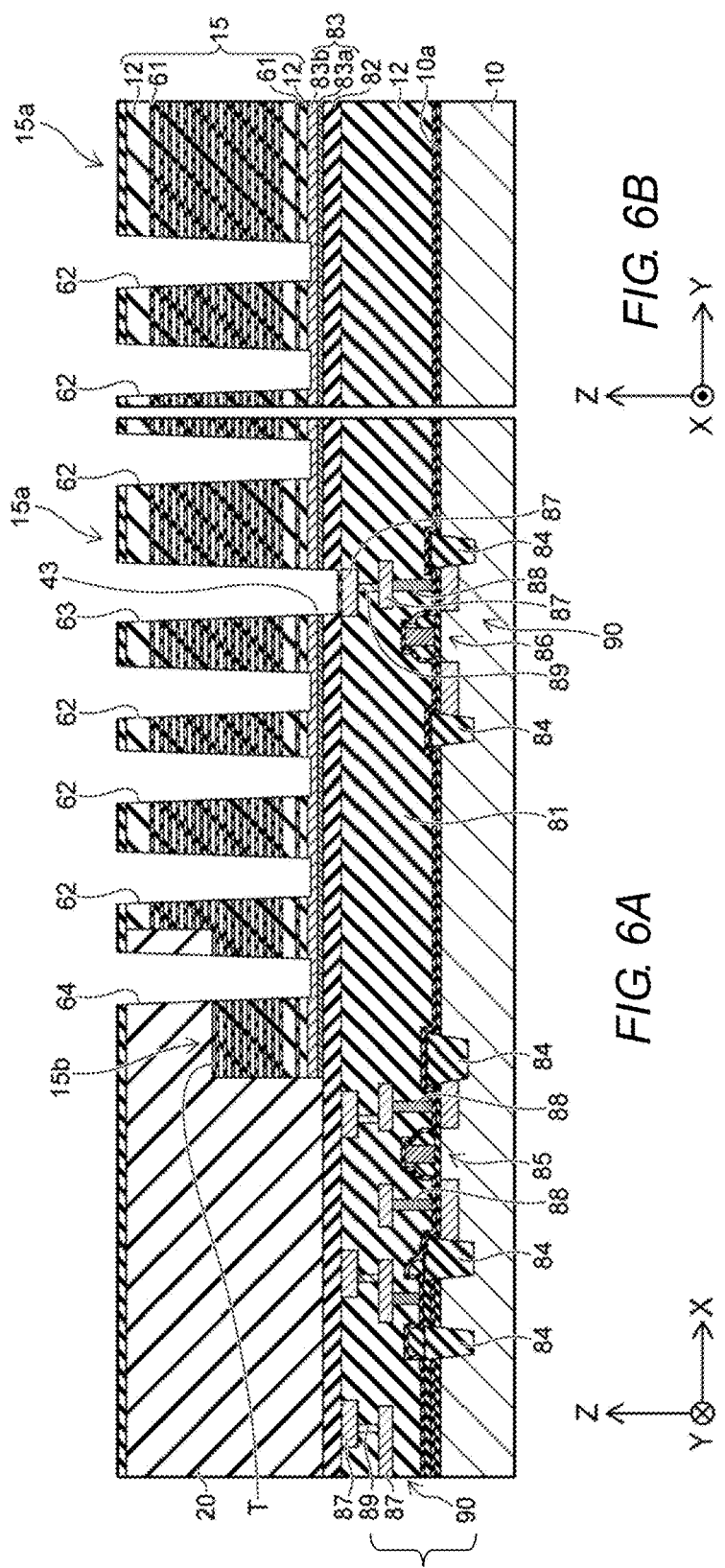

As illustrated in FIGS. 6A and 6B, lithography is performed, and anisotropic etching such as RIE (Reactive Ion Etching) is performed. Through this process, holes 62 and 63 are formed in the central portion 15a of the stacked body 15, and a hole 64 is formed in the interlayer insulating film 20 and the end portion 15b of the stacked body 15. Then, the sacrifice member 60 (refer to FIGS. 5A and 5B) exposed through the bottom surface of the hole 63 is removed. Thus, the hole 63 reaches the wiring 87 of the under-cell circuit 90 through the opening 43. The holes 62 and 64 reach the source electrode film 83.

As illustrated in FIGS. 7A and 7B and FIGS. 4A and 4B, a silicon oxide layer 50 is formed by depositing silicon oxide on the entire surface. The silicon oxide layer 50 is also formed on the inner surfaces of the holes 62, 63, and 64. Then, silicon nitride is deposited on the entire surface to form a charge storage film 49 on the surface of the silicon oxide layer 50. Then, silicon oxide is deposited on the entire surface to form a tunnel insulating film 48 on the surface of the charge storage film 49. The silicon oxide layer 50, the charge storage film 49 and the tunnel insulating film 48 form a memory film 47. Then, silicon is deposited on the entire surface to form a channel film 46 on the surface of the tunnel insulating film 48. Then, silicon oxide is deposited on the entire surface to form a core member 45. The holes 62 to 64 are filled with the core member 45.

The core member 45, the channel film 46 and the memory film 47 are removed from the upper surface of the stacked body 15 and the upper surface of the interlayer insulating film 20. Thus, columnar bodies 40, 41a and 42 are formed in the holes 62, 63 and 64, respectively. Then, a trench is formed in the upper portion of the stacked body 15 so as to extend in the X-direction, and silicon oxide is deposited in the trench to form a silicon oxide member 19 (refer to FIG. 1). The silicon oxide member 19 impinges into some of the columnar bodies 40. The columnar bodies 40 into which the silicon oxide member 19 impinges in this manner become dummy columnar bodies which do not constitute a NAND string.

Figures 7A, 7B:
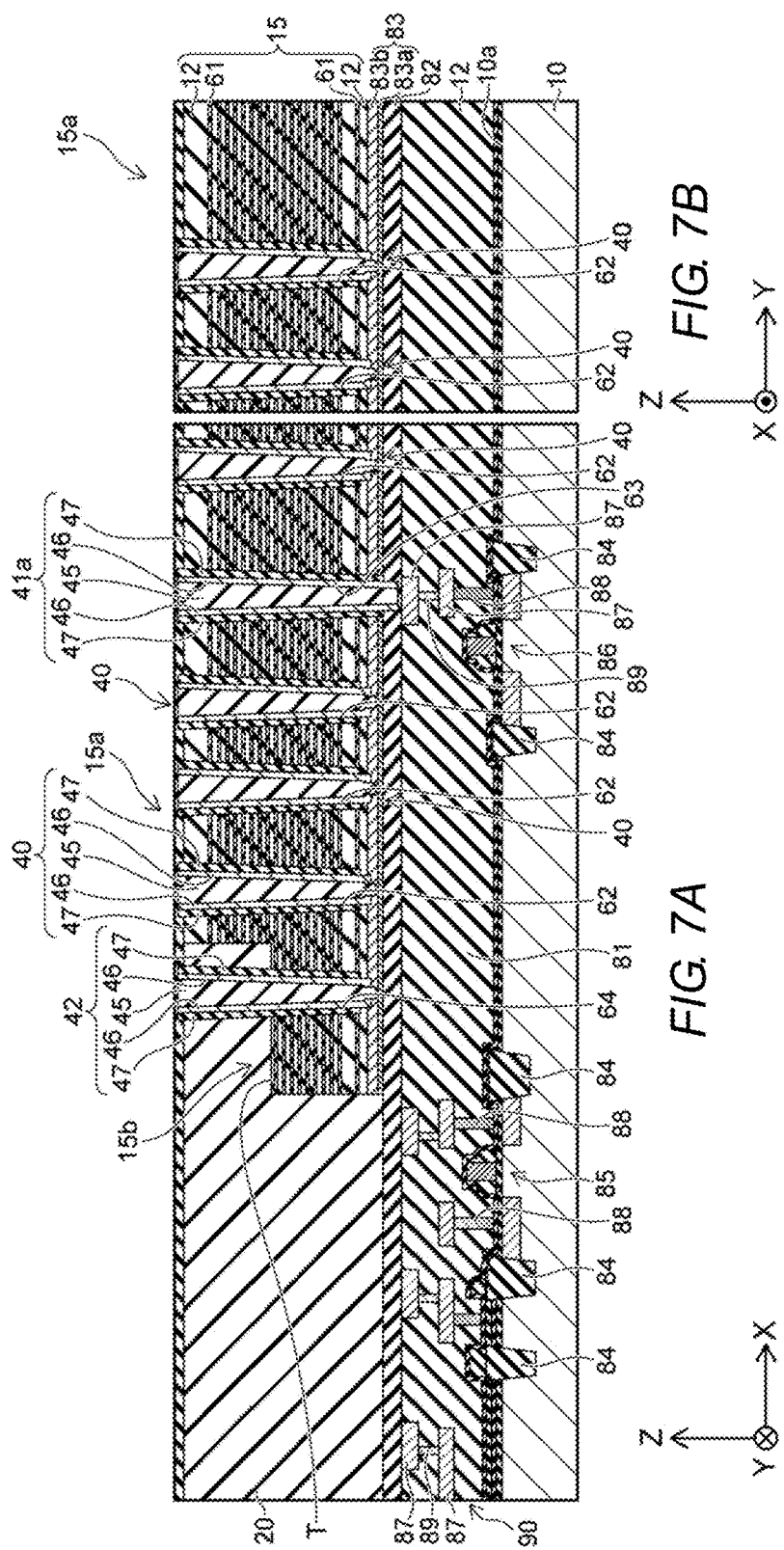
Figures 8A, 8B:
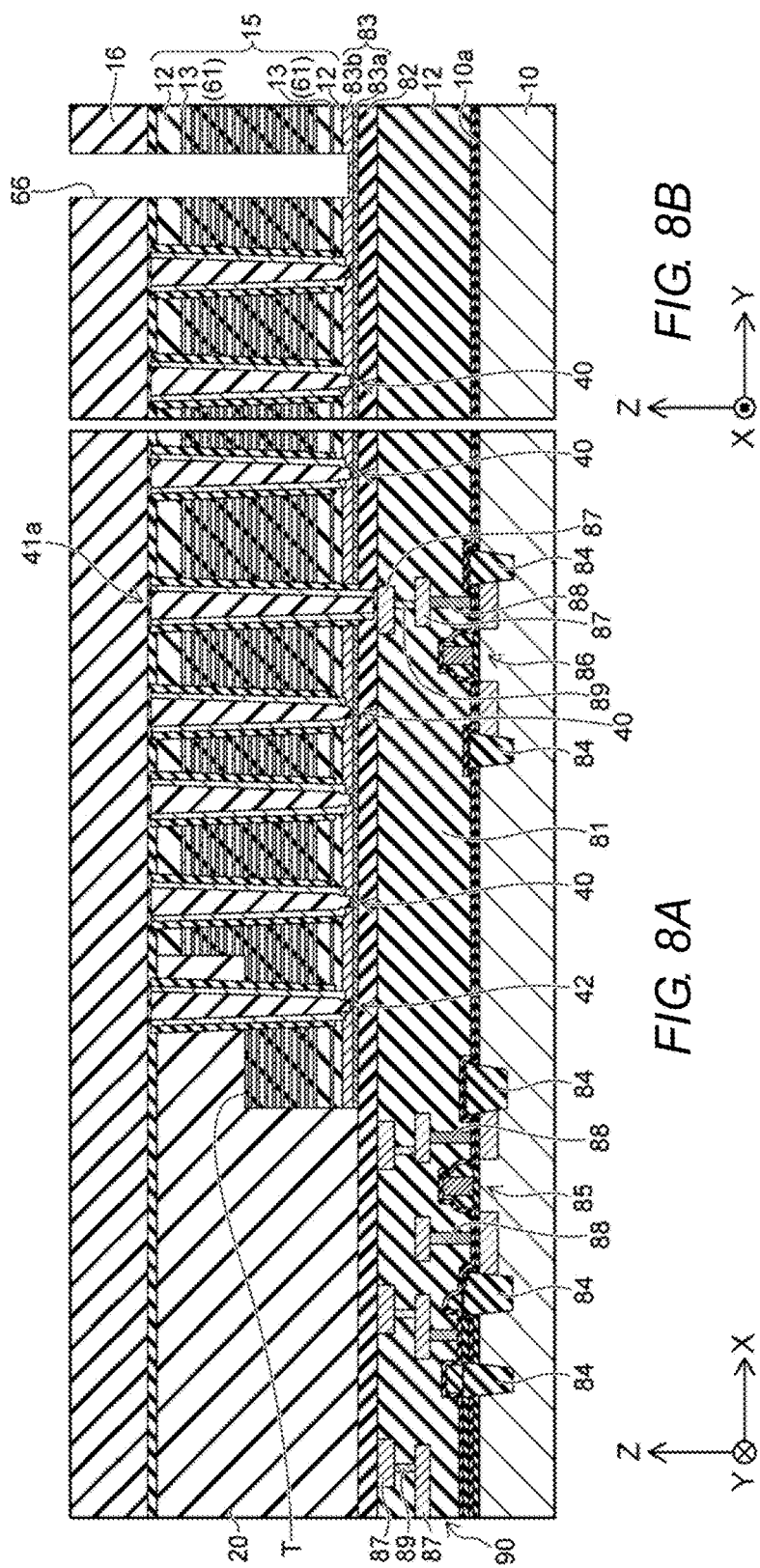

As illustrated in FIGS. 8A and 8B, silicon oxide is deposited to form an insulating film 16 on the stacked body 15 and the interlayer insulating film 20. Then, a slit 66 is formed in the interlayer insulating film 20 and the stacked body 15 so as to extend along the X- and Z-directions. The slit 66 is formed through the interlayer insulating film 20 and the stacked body 15, and exposes the source electrode film 83 through the bottom surface thereof. Then, anisotropic etching such as wet etching is performed to remove the silicon nitride films 61 (refer to FIGS. 7A and 7B) through the slit 66. After the silicon nitride films 61 are removed, spaces 67 (refer to FIGS. 4A and 4B) are formed. At this time, the stacked body 15 is supported by the columnar bodies 40, 41a and 42.

As illustrated in FIGS. 8A and 8B and FIGS. 4A and 4B, aluminum oxide is deposited to form an aluminum oxide layer 55 on the inner surfaces of the spaces 67 through the slit 66. The silicon oxide layer 50 and the aluminum oxide layer 55 constitute a block insulating film 56. Then, titanium nitride is deposited through the slit 66 to form a barrier metal layer 54 on the surface of the aluminum oxide layer 55. Then, tungsten is deposited through the slit 66 to form a main body portion 53 on the surface of the barrier metal layer 54. The main body portion 53 is formed to fill the space 67. Then, etching is performed to remove the main body portion 53, the barrier metal layer 54 and the aluminum oxide layer 55, which are deposited on the insulating film 16 and in the slit 66. Thus, an electrode film 13 including the main body portion 53 and the barrier metal layer 54 is formed in the space 67. In this way, the silicon nitride film 61 (refer to FIGS. 7A and 7B) is substituted with the electrode film 13.

As illustrated in FIGS. 9A and 9B, silicon oxide is deposited, and CMP is performed on the upper surface of the deposited silicon oxide. Through this process, a silicon oxide plate 18 is formed in the slit 66.

Figures 10A, 10B:
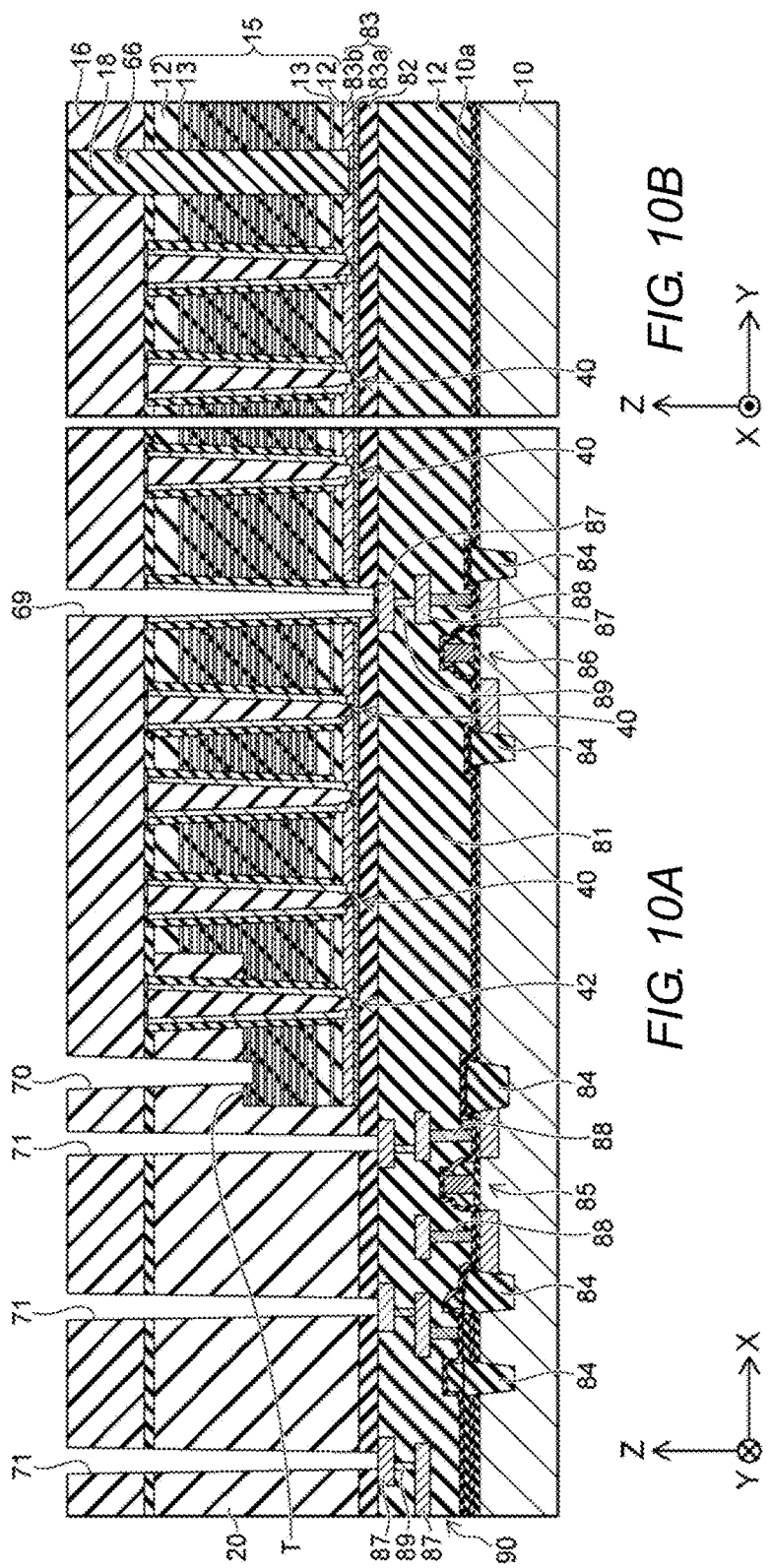

As illustrated in FIGS. 10A and 10B, and in FIGS. 7A and 7B, lithography and RIE are performed to form a hole 69 in the insulating film 16 and the core member 45 of the columnar body 41a, while forming holes 70 and 71 in the insulating film 16 and the interlayer insulating film 20. Through the hole 69, almost the entire part of the core member 45 of the columnar body 41a is removed. Then, the wiring 87 is exposed to the bottom surface of the hole 69. At this time, a part of the core member 45 of the columnar body 41a may remain, and a part of the channel film 46 may be removed. However, the diameter of the hole 69 is set to a smaller value than the diameter of the columnar body 41a, such that the memory film 47 and the channel film 46 are not significantly damaged. Therefore, the channel film 46 and the memory film 47 can serve as a protective film, and the formation of the hole 69 can prevent a damage of the silicon oxide film 12. The electrode film 13 is exposed to the bottom surface of the hole 70. Furthermore, the wiring 87 is exposed to the bottom surface of the hole 71.

As illustrated in FIGS. 11A and 11B, a hole 72 is formed in a region of the insulating film 16 immediately above the columnar body 40. Then, tungsten is deposited on the entire surface, and a planarization process is performed. Thus, a through-contact 51 is formed in the hole 69, a contact 26 is formed in the hole 70, a contact 27 is formed in the hole 71, and a plug 24 is formed in the hole 72. The lower end of the through-contact 51 is connected to the wiring 87, the lower end of the contact 26 is connected to the electrode film 13 in the terrace T, the lower end of the contact 27 is connected to the wiring 87, and the lower end of the plug 24 is connected to the channel film 46 of the columnar body 40. As such, the through-contact 51, the contact 26, the contact 27 and the plug 24 are formed through the same process. As the through-contact 51 is formed, the columnar body 41a becomes the columnar body 41.

As illustrated in FIGS. 3A and 3B, an insulating film 22 is formed, and a bit line 29, intermediate wirings 30 and 31, vias 33 and 34 and an upper wiring 32 are formed in the insulating film 22. In this way, the semiconductor memory device 1 according to the first embodiment is manufactured.

In the semiconductor memory device 1 according to the first embodiment, through-contact 51 is provided extending through the stacked body 15. Thus, the position for the through-contact 51 is not limited to a periphery of the stacked body 15 and the degree of design freedom in layout is increased. As a result, a necessary potential can be applied at any arbitrary portion of the under-cell circuit 90.

Furthermore, the through-contact 51 is formed in a cylindrical shape. Thus, the degree of freedom in arrangement of the through-contact 51 is higher than when the through-contact is formed in a line or slot shape.

Moreover, in the present embodiment, the tunnel insulating film 48 formed of silicon oxide, the charge storage film 49 formed of silicon nitride, the silicon oxide layer 50, and the aluminum oxide layer 55 are provided between the through-contact 51 and the channel film 46 and the electrode film 13. Since any one of the tunnel insulating film 48, the charge storage film 49, the silicon oxide layer 50 and the aluminum oxide layer 55 has an insulating property, a breakdown voltage between the through-contact 51 and the electrode film 13 is generally high.

Furthermore, in the present embodiment, the memory film 47 and the channel film 46 of the columnar body 41 are formed during the process of forming the memory film 47 and the channel film 46 of the columnar body 40 as illustrated in FIGS. 7A and 7B, and the through-contact 51 of the columnar body 41 is formed during the process of forming the contact 26 as illustrated in FIGS. 11A and 11B. For this reason, the number of processes does not need to be increased in order to forma columnar body including the through-contact 51. Therefore, the semiconductor memory device 1 according to the present embodiment can be manufactured at a low cost.

Moreover, in the present embodiment, the through-contact 51 is separated from the silicon nitride film 61 by the memory film 47 and the channel film 46 during the processing of structures illustrated in FIGS. 7A and 7B. For this reason, the through-contact 51 is not exposed to an etching atmosphere for removing the silicon nitride film 61 during the process of replacing the silicon nitride film 61 with the electrode film 13 as illustrated in FIGS. 8A and 8B.

(Second Embodiment)

FIGS. 12A and 12B are plan views illustrating a semiconductor memory device according to a second embodiment. FIG. 12A illustrates a plane including a word line, and FIG. 12B illustrates a plane including a source electrode film. FIGS. 12A and 12B illustrate a region corresponding to the region A of FIG. 1.

As illustrated in FIGS. 12A and 12B, the semiconductor memory device according to a second embodiment includes columnar bodies 41 arranged in a line along the Y-direction in the central portion 15a of the stacked body 15. In the arrangement region of the columnar bodies 41, the columnar bodies 40 are not provided. The source electrode film 83 has an opening 75 formed in the region where the columns of the columnar bodies 41 are disposed, the opening 75 extending in the Y-direction. Therefore, the through-contact 51 in the columnar body 41 is connected to the wiring 87 of the under-cell circuit 90 (refer to FIGS. 3A and 3B) through the central portion 15a of the stacked body 15, the source electrode film 83 and the stopper insulating film 82. Since the opening 75 is formed in the source electrode film 83 and the stopper insulating film 82, the columnar body 41 is separated from the source electrode film 83 and the stopper insulating film 82. Thus, the columnar body 41 is not in contact with the source electrode film 83 and the stopper insulating film 82. The elements other than the above-described elements in the second embodiment generally have the same structures as those of the first embodiment.

Furthermore, the manufacturing method and the effect of the second embodiment are substantially the same as those of the first embodiment.

According to the above-described embodiments, it is possible to provide a semiconductor memory device with a high integration density and manufacture the same.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
   a first insulating film on a semiconductor substrate;
   a first wiring in the first insulating film;
   a first electrode film on the first insulating film;
   a stacked body on the first electrode film and comprising second insulating films and second electrode films alternately stacked along a first direction;
   a first insulating member penetrating the stacked body in the first direction to the first electrode film;
   a first semiconductor film covering an outer surface of the first insulating member and electrically connected to the first electrode film;
   a third insulating film covering an outer surface of the first semiconductor film;
   a first conductive member extending in the first direction and penetrating the stacked body and the first electrode film, the first conductive member being electrically connected to the first wiring;
   a fourth insulating film covering an outer surface of the first conductive member; and
   a second semiconductor film between the first conductive member and the fourth insulating film, wherein
   the fourth insulating film and the third insulating film have a same film structure, and
   the first semiconductor film and the second semiconductor film have a same composition.

2. The semiconductor memory device according to claim 1, wherein an end portion of the stacked body in a second direction crossing the first direction has a stair-stepped shape with a terrace portion for each of the second electrode films.

3. The semiconductor memory device according to claim 2, further comprising:
   a fifth insulating film covering the end portion of the stacked body; and
   a second conductive member extending in the first direction, penetrating the fifth insulating film and connected to one second electrode film at the terrace portion, wherein
   the first conductive member has the same composition as the second conductive member.

4. The semiconductor memory device according to claim 1, wherein the first conductive member is a cylindrical shape.

5. The semiconductor memory device according to claim 1, further comprising:
   a second insulating member in the stacked body and extending in the second direction crossing the first direction, wherein
   the first conductive member is between the first semiconductor film and the second insulating member in a third direction crossing a plane including the first and second directions.

6. A semiconductor memory device, comprising:
   a first insulating film on a semiconductor substrate;
   a first wiring in the first insulating film;
   a first electrode film on the first insulating film;
   a stacked body on the first electrode film and comprising second insulating films and second electrode films alternately stacked along a first direction;
   a first insulating member penetrating the stacked body in the first direction to the first electrode film;
   a first semiconductor film covering an outer surface of the first insulating member and electrically connected to the first electrode film;
   a third insulating film covering an outer surface of the first semiconductor film;
   a first conductive member extending in the first direction and penetrating the stacked body and the first electrode film, the first conductive member being electrically connected to the first wiring; and
   a fourth insulating film covering an outer surface of the first conductive member, wherein
   the fourth insulating film and the third insulating film have a same film structure,
   the third insulating film includes:
      a first insulating layer in contact with the first semiconductor film;
      a second insulating layer covering an outer surface of the first insulating layer; and
      a third layer between the first insulating layer and the second insulating layer, the fourth insulating film includes:
      a fourth insulating layer;
      a fifth insulating layer covering an outer surface of the fourth insulating layer; and
      a sixth layer provided between the fourth insulating layer and the fifth insulating layer,
   the first insulating layer has the same composition as the fourth insulating layer,
   the second insulating layer has the same composition as the fifth insulating layer, and
   the third layer has the same composition as the sixth layer.

7. The semiconductor memory device according to claim 6, wherein the third layer between the first insulating layer and the second insulating layer is a charge storage layer.

8. The semiconductor memory device according to claim 6, wherein
   the first insulating layer has a thickness that is the same as a thickness of the fourth insulating layer,
   the second insulating layer has a thickness that is a same as a thickness of the fifth insulating layer, and
   the third layer has a thickness that is the same thickness as a thickness of the sixth layer.

* * * * *